United States Patent [19]
Corriveau et al.

[11] Patent Number: 5,923,097
[45] Date of Patent: Jul. 13, 1999

[54] SWITCHING SUPPLY TEST MODE FOR ANALOG CORES

[75] Inventors: Michael P. Corriveau, Underhill; Christopher Ro, Burlington; Stephen D. Wyatt, Jericho, all of Vt.

[73] Assignee: International Business Machines Corporation, Armonk, N.Y.

[21] Appl. No.: 08/900,074

[22] Filed: Jul. 24, 1997

[51] Int. Cl.[6] .................................................. G01R 31/00
[52] U.S. Cl. ........................ 307/29; 324/73.1; 324/537; 324/771
[58] Field of Search ................... 307/29, 64, 18; 324/537, 771, 73.1

[56] References Cited

U.S. PATENT DOCUMENTS

| | | | |
|---|---|---|---|
| 3,755,686 | 8/1973 | Woods | 307/29 |
| 4,465,971 | 8/1984 | Abeyta | 324/537 |
| 4,686,462 | 8/1987 | Prilik . | |
| 4,965,512 | 10/1990 | DeBar et al. . | |
| 4,973,904 | 11/1990 | Sonnek | 324/537 |
| 5,068,604 | 11/1991 | Van De Lagemaat | 324/537 |
| 5,422,517 | 6/1995 | Verney et al. | 307/29 |
| 5,481,551 | 1/1996 | Nakano et al. | 324/73.1 |
| 5,594,359 | 1/1997 | Hashimoto . | |

*Primary Examiner*—Albert W. Paladini
*Attorney, Agent, or Firm*—Whitham, Curtis & Whitham; Eugene I. Shkurko

[57] ABSTRACT

An integrated circuit such as an application specific integrated circuit (ASIC) which has operational power supplies provided for different respective analog cores and digital logic and/or macros may be tested using on-chip power supplies, preferably comprising operational amplifiers connected as voltage followers and controlled by a band-gap voltage source or a voltage divider, drawing power from a single power supply to the chip which is generally provided in a standardized pin-out location. Disablement of respective operational amplifiers also provides electrical isolation of the respective cores during testing. A reduced pin-count is involved in the testing procedure since operational power supply connections can be open circuited or "tri-stated". On-chip power supplies for testing provides power while avoiding a need to provide low-noise power supplies and/or complex switching in a test system or to utilize custom front-end boards or both to provide power to arbitrary chip or package connections.

19 Claims, 2 Drawing Sheets

SWITCHING SUPPLY TEST MODE FOR ANALOG CORES

BACKGROUND OF THE INVENTION

1. Field of the Invention

The present invention generally relates to testing of application specific integrated circuits (ASICS) and, more particularly, to the testing of analog cores when included therein.

2. Description of the Prior Art

The high performance and reliability of integrated circuits has led to the development not only of integrated circuits of general applicability such as processors, logic arrays and memories but special purpose circuits, as well. Such special purpose circuits of designs which are not necessarily manufactured in large volume are generically referred to as application-specific integrated circuits (ASICS) and may comprise specially adapted digital logic circuits and analog circuits, referred to hereinafter as cores, as well. It is often advantageous to include digital and analog circuits on the same chip for economy of packaging, short signal propagation time and noise immunity, particularly when the digital circuits are used to exercise control over the analog circuits.

Whether of general or specific applicability, integrated circuits must be tested to assure their functionality as part of the manufacturing process. So-called burn-in may also be required to allow the electrical properties which will be maintained by the integrated circuit once it is placed in service to be ascertained.

Digital logic integrated circuits of general applicability such as processors and memories, of course, represent the majority of integrated circuit devices currently being manufactured. Nevertheless, libraries of circuits and designs (the specific circuit design and specifications sometimes being individually referred to as "books" or "macros") which have been developed for inclusion in ASICs exist and may be included in the design of any integrated circuit. Such special-purpose circuits may be generically referred to as cores or macros.

Apparatus for testing and/or burn-in of integrated circuits is complex and costly, particularly since it must include precision power supplies of relatively high current capacity, high frequency, low-noise signal generators, complex switching arrangements or interface cards to direct power and signals to desired connections (e.g. pins) of the integrated circuit device or module and contact arrays which can make temporary contacts with hundreds or thousands of pins while withstanding potentially hundreds of package insertions without causing damage or wear to the package, chip or structure in an intermediate state of packaging.

Accordingly, designs of such apparatus have generally been directed to burn-in and testing of general purpose integrated circuit designs which only require a few power supplies, at most, when different technologies are used in the chip or module (e.g. so-called BiCMOS including both bipolar and CMOS transistor circuits). Likewise, pin-out patterns of standard chips have adopted certain conventions for the placement of power, input and output pins to reduce switching circuit complexity in testers.

Even in such hybrid circuits, so-called level-shifting circuits are sometimes provided to derive plural necessary voltages from a single supply for operation. Burn-in, which is usually conducted at increased voltage, can often be achieved with relatively simple switching arrangements which may be placed on the chip to adjust voltage ratios relative to an elevated burn-in supply voltage applied to the chip or module.

However, ASICs which include analog cores generally require much different voltages for operation (or burn-in) of analog cores than those required for digital cores. Moreover, different analog voltages may be required in view of the intended function or voltage swing of different analog cores which may be included on the same chip, regardless of the technology by which the analog cores are fabricated. In contrast, the operating voltages and logic levels used in digital circuits can be optimized to the electrical properties of the digital circuits. Therefore, provision for applying an increased number of arbitrary voltages which may be required for ASICs of arbitrary design with a fully generalized test apparatus is not economically feasible.

More specifically, ASICs which include both analog cores and digital macros or circuits require multiple decoupled power supplies for normal operation, on pins that would normally be dedicated to signal inputs or outputs (I/Os). Given that chip packaging and connection pin-out patterns have become somewhat standardized, this implies that commercially available and economically feasible testers generally do not include power supplies which can deliver adequate currents or multiple analog voltage levels and, further, accommodate provision of power to connections on ASICs which would receive only signals on a fully digital integrated circuit.

In view of the expense of switching to accommodate provision of power rather than signals to particular integrated circuit package pins, unique or custom interface boards are generally used even though such interface boards are, themselves, very expensive and subject to wear and damage from handling during connection to each of a number of integrated circuits to be tested. Even when the same interface board may be used for different ASIC designs, the cost overhead of interface boards is significant while use of interface boards does not address the issue of the cost of multiple, decoupled, high-current power supplies.

In summary, there has been no technique or apparatus known in the art which is capable of reducing the high cost of testing and/or burn-in of ASICs. Given that ASICs are, by their nature, a low volume product having significant design, development and production costs which can only be amortized over a limited number of devices, significant additional costs of testing and/or burn-in severely limit the applications in which ASICs can be economically employed.

SUMMARY OF THE INVENTION

It is therefore an object of the present invention to provide an on-chip arrangement for facilitating testing of analog cores in application specific integrated circuits (ASICs).

It is another object of the invention to provide power to analog cores during testing of ASICs from the power supply to the digital circuits.

It is a further object of the invention to avoid the use of switching of pin connections and/or unique or custom frontend boards for testing or burn-in of ASICS.

It is yet another object of the invention to provide testing of ASICs over a reduced number of pins or other connections thereto.

In order to accomplish these and other objects of the invention, an integrated circuit is provided including a first circuit and a first power supply for externally supplying power to the first circuit, a second circuit and a second power supply for supplying power to the second circuit from an external source, and a power source connected to the first power supply for supplying power to the second circuit from the first power supply independently of the second power supply.

In accordance with another aspect of the invention, a method of testing an application specific integrated circuit having a first circuit, a first connection for providing power to the first circuit from a first power source, a second circuit and second connection for supplying power to the second circuit from a second power source is provided comprising the steps of disconnecting the second power source from the application specific integrated circuit, selectively enabling the second circuit, and supplying power to the second circuit from said first power source.

BRIEF DESCRIPTION OF THE DRAWINGS

The foregoing and other objects, aspects and advantages will be better understood from the following detailed description of a preferred embodiment of the invention with reference to the drawings, in which:

FIG. 3 is a high-level schematic diagram of a test arrangement for ASICs including the invention.

DETAILED DESCRIPTION OF A PREFERRED EMBODIMENT OF THE INVENTION

Figure 1:
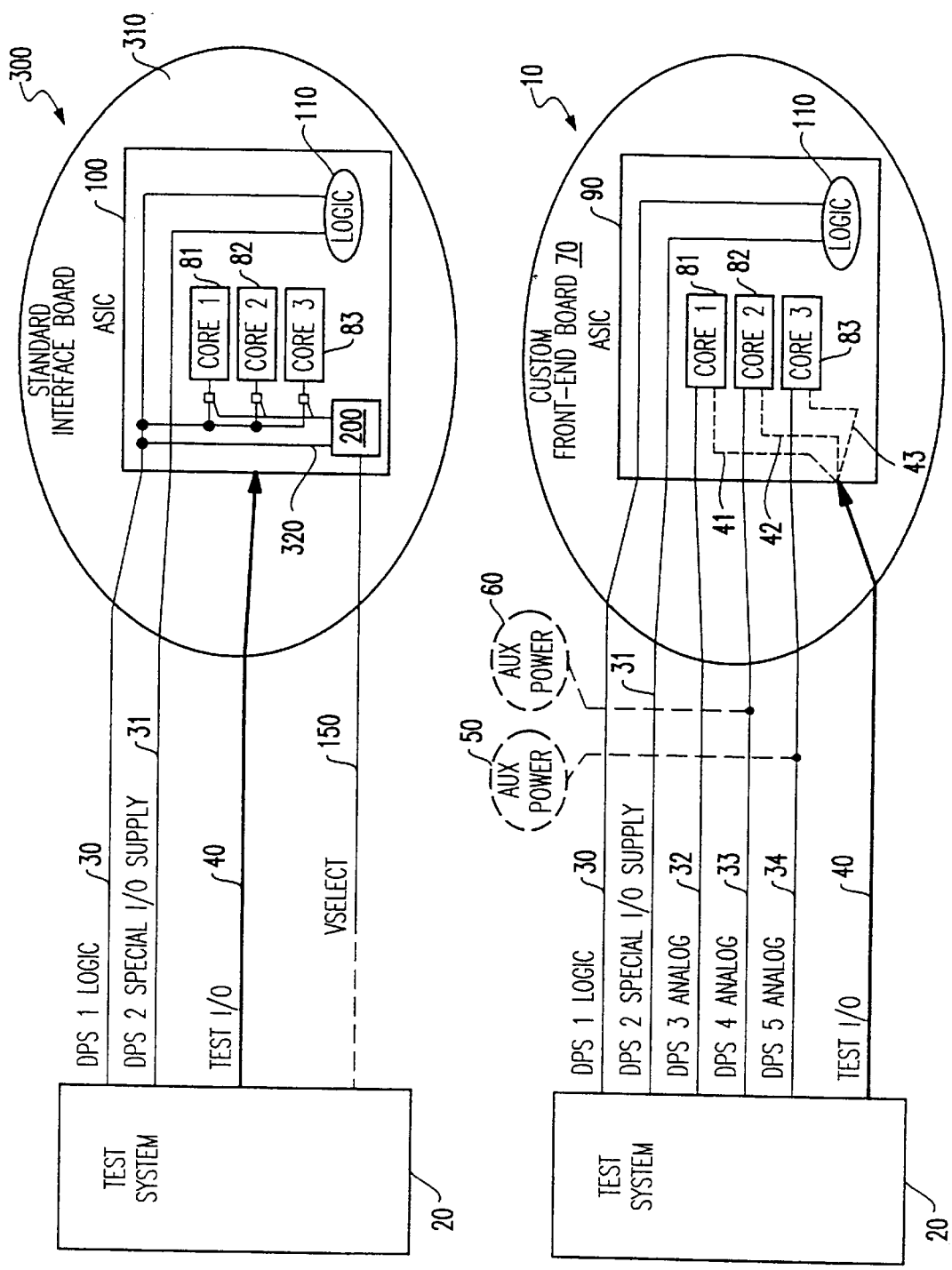
FIG. 1 is a high-level schematic diagram of a currently used testing arrangement for ASICs including analog cores.

Referring now to the drawings, and more particularly to FIG. 1, there is shown, in high level schematic form, a conventional test arrangement 10 for ASICs including analog cores is shown. It is to be understood that no portion of FIG. 1 is admitted to be prior art as to the present invention and the illustration is arranged to facilitate a rapid understanding of the nature of the present invention and to contrast the invention with arrangements over which the present invention provides an improvement. Accordingly, FIG. 1 has been designated as "related art".

For testing, prior ASIC 90 is mounted on a custom front-end board 70 which provides specialized connectivity of various power supplies to ASIC 90 and to supplement any pin switching which may or may not be provided directly by test system 20. Specifically, digital power supply DPS1 will generally be provided over connection 30 to dedicated pins of a generally standardized pin layout which may or may not be common to other common integrated circuits such as processors, memories and logic arrays. Similarly, a second special power supply may be provided over connection 31 to conventionally placed pins to accommodate hybrid integrated circuits or provide input or output (I/O) logic level conversion.

Test system 20 may be of any arbitrary type suitable for the purpose and the details of the test system 20 are not important to the practice of the invention. Typically, the test system 20 will include at least the two power supplies discussed above since these requirements will be common to many integrated circuit designs (e.g. for logic 110, which may comprise or be regarded as digital logic) to which the test system 20 may be applied. Additionally, test system 20 will include a plurality of signal outputs 40 which will be connected to I/O pins on the integrated circuit package and provide various, often programmed, combinations of signals to carry out any desired degree of functional testing. To accommodate ASICs, the I/O signals may include core enable (or "test mode") signals 41, 42, 43, etc. to enable or disable specific analog or digital cores 81, 82, 83, etc. on the ASIC chip to enable testing of respective cores in sequential and electrically isolated fashion or in desired combinations.

To the extent needed by respective ones of cores 81, 82 and 83, additional power supplies may be required and could be provided by test system 20 over connections 32, 33, 34, etc. However, it should be noted that provision of such additional power supplies is an expensive specialization of the test system 20 to accommodate ASICs with analog cores which may be seldom used, if at all, other than for burn-in or testing of ASICs. If not provided by test system 20, such power supplies must be provided by additional auxiliary power supplies such as 50, 60, external to the test system 20. Therefore, there is a trade-off between the generality and expense of test system 20 and the need for and expense of additional test equipment as well as the complications of control thereof in conjunction with test system 20 and interfacing to the ASIC by custom front-end board 70.

Further, since these power supplies must be connected to the ASIC over pins which would be I/O pins on integrated circuits of conventional design, expensive internal switching (which would affect signal integrity, such as waveform shape) and/or a custom front-end board 70 must be provided which is similarly expensive in view of the potentially unique design, special hardware for making temporary connections without wear or damage and custom manufacturing involved. While some "standardization" among ASIC pin-out patterns may exist to allow a particular custom front-end board to be used for a plurality of ASIC designs, there is a clear trade-off between design flexibility, a requirement for which is characteristic of ASICs, and the expense of a unique board to accommodate a design with non-standard pin-out. An essentially custom front-end board is required in any event in view of the need to make power connections to pins which would otherwise be provided with logic or analog signals in accordance with more conventional integrated circuit designs.

Figure 2:
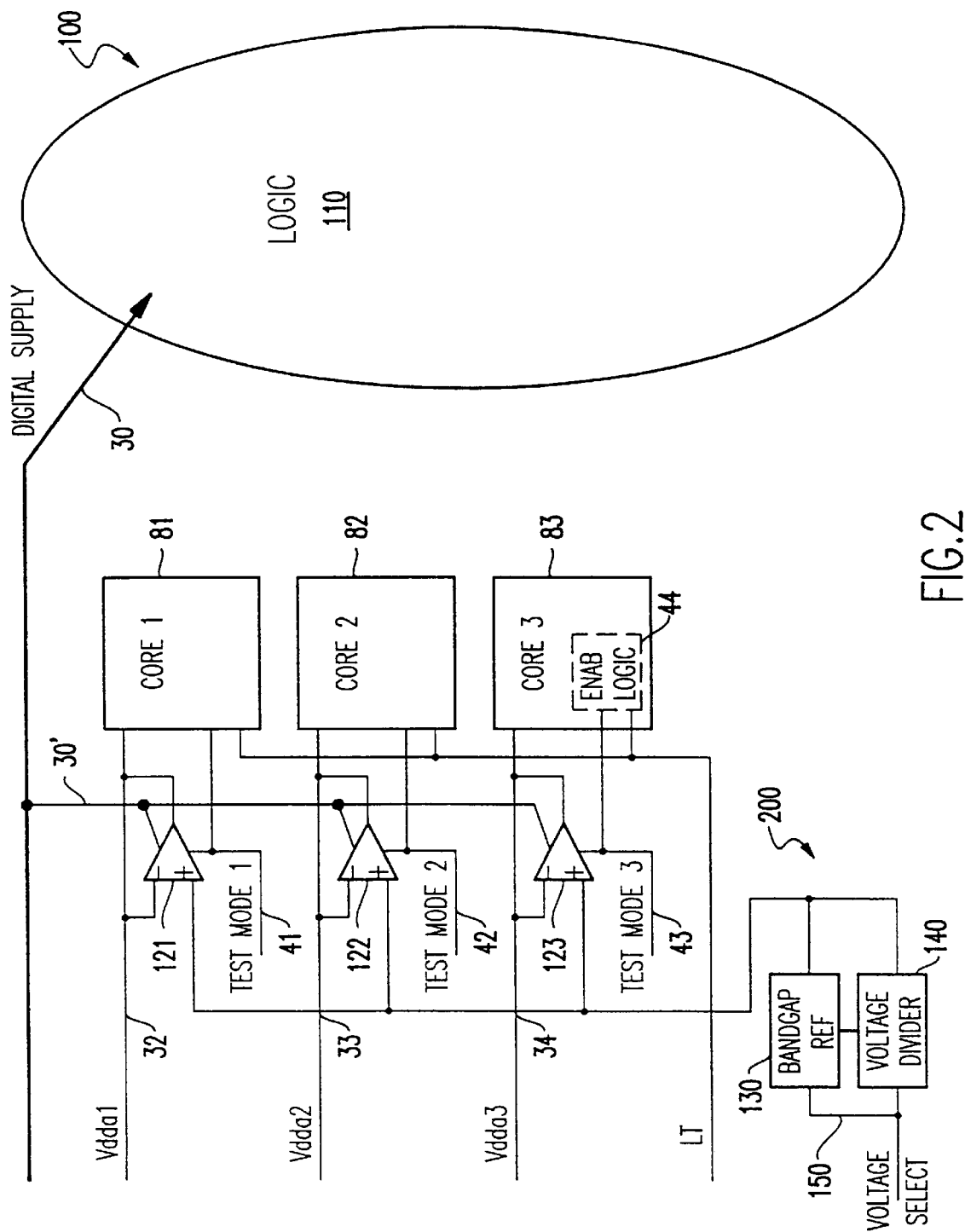
FIG. 2 is a high-level schematic diagram of a chip including the invention.

Referring now to FIG. 2, the power supply arrangement 100 for analog cores of an ASIC is schematically illustrated. Common to FIG. 1, a power supply for digital logic 110 is provided over connection 30. Power supply connections 32, 33 and 34 to cores (assumed to be analog or otherwise requiring a unique voltage) 81, 82, 83 during normal operation of the ASIC are also shown but should be understood to depict the portion thereof which may, preferably, exist on an ASIC chip.

In accordance with the invention, respective operational amplifiers 121, 122, 123 are provided for each core 81, 82, 83. If a core requires more than a single power supply (which will not generally be the case) additional operational amplifiers can be provided in the same manner but additional control arrangements 200, as will be described below, must also be provided in accordance with the maximum number of voltages required by any core. Power is provided in common to the operational amplifiers 121, 122, 123 over connection 30' from the digital logic supply connection 30 (although it should be recognized that connection 30, as illustrated in FIG. 2, exists on the ASIC chip). Alternatively, it should be understood that power could be supplied from connection 31 (FIG. 3), as it may exist on the ASIC chip or various operational amplifiers could be connected, in common or singly, to either power supply connection 30 or 31 or any other power supply connection which may exist on the chip, preferably with a conventional pin-out location.

It should be noted that both an input and the output of the operational amplifiers are connected together for feedback and to power supply connections 32, 33, 34, respectively, as a single node. Further, a ground or reference supply connection for respective operational amplifiers is made to the cores and to test mode input terminals corresponding to connections 41, 42, 43, discussed above to allow selective enablement or disablement of the cores and their respective operational amplifiers for test individually or in selected combinations. This connection arrangement has several advantageous functions.

First, the test mode signals allow enablement of respective cores singly (or potentially in combination) together with their respective operational amplifiers during testing. Further, if operated singly or the cores are otherwise electrically isolated by virtue of the design, the reference level supplied over the test mode signal connection may be used to diminish or augment the voltage provided to the respective cores which may be allowed to "float" or be referenced to an essentially arbitrary voltage level. Moreover, the reference voltage test mode signal may be applied as a signal over a signal pin of the ASIC which can be done from any test system 20 without customization of the front-end or interface board (e.g. 10 of FIG. 1 but more importantly, allowing a standard interface board 310 of FIG. 3 to be used).

Secondly, the connection of the output to a negative input through a feedback node of the operational amplifier provides a circuit configuration which will be recognized by those skilled in the art as a so-called voltage follower arrangement. In such as arrangement, the output will follow the voltage applied at the positive input while providing a potentially much higher current level than drawn at that other input. In this sense, the respective operational amplifiers provide a voltage regulation function while supplying a potentially relatively high current from another source.

Third, since relatively high current levels can be supplied by the respective operational amplifiers, when enabled, no power need be supplied over power connections 32, 33, 34 during testing and these pins may be and preferably are open-circuited. This can also be readily accomplished as a signal (e.g. a floating, so-called tri-state signal generally available from test system 20 and no switching to supply power to pins which would be an I/O pins on a conventional integrated circuit design package, chip or intermediate structure need be provided.

The control voltage to determine the voltage applied to any ASIC core 81, 82, 83 is preferably provided by a band-gap reference 130 such as a diode, series diode chain or Zener diode or a voltage divider 140, details of which are unimportant to the practice of the invention. Either can be formed with a relatively small "footprint" and at high accuracy on the ASIC chip as will be evident to those skilled in the art. Band-gap references require only the formation of one or more junctions and a few connections and voltage dividers require only a relatively few deposits of resistive materials.

Since voltage dividers derive output voltages in accordance with a ratio of impedances, they are relatively immune to variation of individual resistances because manufacturing variation usually causes proportional changes in resistance values of all resistive elements concurrently formed. Both such types of sources are preferably provided and switching between them in accordance with a voltage select signal 150 may be accomplished in any of a number of simple ways which will be evident to those skilled in the art in view of this discussion of the control arrangements 200 of the invention.

Referring now to FIG. 3, a testing arrangement 300 including the invention is shown in a high-level schematic form comparable to FIG. 1. Power supply connections 30 and 31 are shown as are I/O connections 40. It should be noted that standardized power supply connections 30, 31 are now the only power connections between the test system 20 and the ASIC, allowing use of a standard interface board 310 instead of a custom front-end board 10 of FIG. 1. Connections 41, 42 and 43 included in I/O connections 40 and shown in FIGS. 1 and 2 are omitted in the interest of clarity. The $V_{select}$ signal may be provided from test system 20 or from auxiliary equipment. Even in the latter case, such circuitry is much simpler and far less costly than auxiliary power supplies 50, 60, etc. of FIG. 1. Only a single input pin need be used for each control voltage source, only one of which will generally be required. Perhaps more importantly, only the basic requirements for any test system 20 need be provided thereby and no switching is required to accommodate custom pin-out patterns.

In operation, it is to be understood that cores 81, 82, 83 are preferably tested individually or in compatible combinations. Compatible combinations are generally determined in accordance with the test or burn-in voltage required and electrical signal isolation from each other and other circuits which may be affected by signals therein. Such combinations, if possible, may involve numerous considerations in the design of the ASIC chip which will be evident to those skilled in the art and are not usually provided in view of the generally marginal reduction in testing time over serial testing of all cores. Individual or compatible groups of cores are selected and enabled by test enable signals 41, 42, 43, as described above, applied as signals through the test system 20.

A voltage select signal, $V_{select}$, 150 controls whether the voltage supplied to an input of operational amplifiers 121, 122, 123 (but which will only be effective at the individual operational amplifier(s) which are enabled by a test mode signal) is supplied by band-gap reference 130 or voltage divider 140, either or both of which may be connected to either digital power supply connection 30 and/or 31 as shown at 320 of FIG. 3 for power, bias and/or reference. (It should be noted that $V_{select}$ is generally used only for burn-in and, hence, is generally higher than the voltage provided by the band-gap reference 130. Therefore, the application of any higher voltage as $V_{select}$ can be used to override the band-gap reference by a very simple gating/blocking arrangement (e.g. a pair of diodes) while allowing the magnitude of $V_{select}$ to the freely chosen or controlled for control of the voltage supplied from the voltage divider.) By the same token, an external voltage could be applied for the same purpose(s), possibly as a selectable value of $V_{select}$. As alluded to above, the operational power supply connections to the cores nay be open-circuited and allowed to "float" since appropriate power supply voltages will be supplied to the cores through respective operational amplifiers 121, 122, 123, under control of the control arrangement(s) 200. Optionally, the voltage applied to the core(s) by the respective operational amplifiers can be monitored on the operational power supply pins.

As each core 81, 82, 83 is tested, an appropriate value of $V_{select}$ is also applied on connection 150 in accordance with the core selection responsive to test mode signals asserted over lines 41, 42, 43 to select the core(s) to be tested at each phase of the test sequence while combinations of test signals appropriate to the selected core(s) are applied to other I/O connections 40 to the chip. Alternatively, for other tests such a so-called IDDQ test which checks quiescent current, a so-called LT signal 45 may be asserted, generally over a dedicated pin or connection, to disconnect terminating resistors during tests for excess current draw in the chip. Incidentally, it is considered desirable to perform a logical operation on the test mode signal and another signal such as the LT signal for controlling the enablement of a core and/or the test configuration as indicated at 44 of FIG. 2 in order to assure that a desired core can be enabled independently of whether or not the associated operational amplifier is enabled or connected to provide power to the core. Such logic is preferably provided internal to the core. However, many logic functions or connections could be used such as providing logical combinations of the test mode signal, the LT signal or any other signal to control, for example, transmission gates at the input and/or output of the operational amplifier, connection 30' and the like, or omitted, as the circuit design and test configuration may require. Disablement of other cores allows any performance problem to be rapidly isolated to a specific core or compatible combination thereof since electrical isolation is provided by concurrent disablement of operational amplifiers corresponding to disabled cores while the power for enabled cores is supplied entirely from the logic level power supply 30, 31.

In view of the foregoing, it is seen that the invention provides for testing and/or burn-in of ASICs utilizing analog cores using standard test systems which accommodate general purpose logic circuits and standard interface boards with, at most, slight alteration to accommodate $V_{select}$, a separate supply for control arrangement 200. Power to cores may thus be supplied during testing or burn-in directly from the logic power supply connections 30, 31 which are generally in standardized pin-out locations on the package, chip or other intermediate structure.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. An integrated circuit including
   a first circuit,
   a first means for externally supplying power to said first circuit,
   a second circuit,
   a second means for supplying power to said second circuit from an external source, and
   a power source means connected to said first means for supplying power to said second circuit from said first means independently of said second means.

2. An integrated circuit as recited in claim 1, wherein said power source means includes
   an operational amplifier connected in parallel with a connection from said second means to said second circuit.

3. An integrated circuit as recited in claim 1, wherein said power source means includes
   an operational amplifier connected as a voltage follower having a feedback node connected to said second means.

4. An integrated circuit as recited in claim 1, further including
   means for selectively disabling one of said first circuit and said second circuit.

5. An integrated circuit as recited in claim 1, further including
   a third circuit,
   a third means for supplying power to said third circuit from an external source,
   a power source means connected to said first means for supplying power to said second circuit from said first means independently of said second means, and
   means for selectively disabling one of said second circuit and said third circuit.

6. An integrated circuit as recited in claim 1, further including
   a reference voltage source for said power source means.

7. An integrated circuit as recited in claim 6, wherein said reference voltage source includes a voltage divider reference source.

8. An integrated circuit as recited in claim 6, further including
   plural reference voltage sources for said power source means, and
   means for selecting a reference voltage for said power source means.

9. An integrated circuit as recited in claim 6, wherein said reference voltage source includes a band-gap reference source.

10. An integrated circuit as recited in claim 9, wherein said reference voltage source includes a voltage divider reference source.

11. An integrated circuit as recited in claim 10, further including
    means for selectively providing an output of one of said band-gap reference source and an output of said voltage divider reference source to said power source means.

12. A method of testing an application specific integrated circuit having a first circuit, first means for providing power to said first circuit from a first power source, a second circuit and second means for supplying power to said second circuit from a second power source, said method comprising the steps of
    disconnecting said second means from said application specific integrated circuit,
    selectively enabling said second circuit, and
    supplying power to said second circuit from said first means.

13. A method as recited in claim 12, including the further step of
    selectively determining a voltage applied to said second circuit.

14. A method as recited in claim 12, wherein said step of supplying power includes the further step of
    deriving a reference voltage from a voltage divider voltage source.

15. A method as recited in claim 12, wherein said step of supplying power includes the further step of
    deriving a reference voltage from a band-gap reference voltage source.

16. A method as recited in claim 15, including the further step of controlling a voltage available from said voltage divider source.

17. A method as recited in claim 15, wherein said step of supplying power includes the further step of
    deriving a reference voltage from a voltage divider voltage source.

18. A method as recited in claim 17, wherein said step of supplying power includes the further step of
    selecting one of said band-gap reference voltage source and said voltage divider voltage source.

19. A method as recited in claim 18, including the further step of controlling a voltage available from said voltage divider source.

* * * * *